United States Patent
Desplats et al.

(10) Patent No.: US 7,417,424 B2
(45) Date of Patent: Aug. 26, 2008

(54) MAGNETIC-FIELD-MEASURING DEVICE

(75) Inventors: Romain Desplats, Toulouse (FR); Olivier Crepel, Mondonville (FR); Felix Beaudoin, Union City, CA (US); Philippe Perdu, Toulouse (FR)

(73) Assignee: Centre National d'Etudes Spatiales, Paris (FR)

( * ) Notice: Subject to any disclaimer, the term of this patent is extended or adjusted under 35 U.S.C. 154(b) by 0 days.

(21) Appl. No.: 10/575,231

(22) PCT Filed: Oct. 8, 2004

(86) PCT No.: PCT/FR2004/002561

§ 371 (c)(1),
(2), (4) Date: Jul. 10, 2006

(87) PCT Pub. No.: WO2005/036187

PCT Pub. Date: Apr. 21, 2005

(65) Prior Publication Data

US 2007/0052412 A1 Mar. 8, 2007

(30) Foreign Application Priority Data

Oct. 8, 2003 (FR) ................................ 03 11769

(51) Int. Cl.
*G01R 33/12* (2006.01)
(52) U.S. Cl. ........................ 324/247; 324/252; 324/258; 324/750

(58) Field of Classification Search ............... 324/207.2, 324/207.21, 207.23, 207.25, 251–252, 173–175, 324/244, 247, 249, 258, 260, 262, 263, 500, 324/537, 750, 763
See application file for complete search history.

(56) References Cited

U.S. PATENT DOCUMENTS

| 4,465,974 A | 8/1984 | Sparks |
| 4,995,165 A | 2/1991 | Daniels et al. |
| 5,351,005 A | 9/1994 | Rouse et al. |
| 5,880,586 A | 3/1999 | Dukart et al. |
| 6,486,663 B1 | 11/2002 | Steinlechner |
| 2001/0043065 A1 | 11/2001 | Heid |

FOREIGN PATENT DOCUMENTS

DE 198 12 307 9/1999

*Primary Examiner*—Reena Aurora
(74) *Attorney, Agent, or Firm*—Young & Thompson

(57) ABSTRACT

A device (16) used to measure at least one component of a magnetic field, includes a magnetoresistive sensor (102) and a measuring chain (28). The input of the measuring chain is connected to the magnetoresistive sensor (102), while the output thereof is intended to supply information that is representative of the magnetic field in the region of the sensor. In addition, the measuring chain (28) includes elements (136) for isolating a frequency component of the signal from the sensor representative of the magnetic field for a unique predetermined frequency (FI).

9 Claims, 4 Drawing Sheets

MAGNETIC-FIELD-MEASURING DEVICE

The present invention relates to a device for measuring a magnetic field of the type comprising a magnetoresistive or magnetoinductive sensor and a measurement chain, one input of which is connected to the magnetoresistive or magnetoinductive sensor and the output of which is able to provide a piece of information representative of the magnetic field in the region of the sensor.

In order to control integrated circuits or to measure the radiation produced by an electrical circuit during operation, it is known to position one or more sensors above the circuit in order to determine the magnetic or electrical field produced by the operation of the circuit. In order to detect the magnetic field, such installations use antennae or "SQUIDS", which stands for Superconducting Quantum Interference Device.

Recently, it has been envisaged to measure the magnetic field produced by an electronic circuit during operation by using a magnetoresistive sensor and, more precisely, a GMR type sensor (Giant Magnetic Resistor).

Such magnetoresistive sensors are electronic elements whose resistance varies in accordance with the magnetic field in which they are positioned. Those components are relatively directional so that their resistance varies only in accordance with one component of the magnetic field, that component extending in the selected measurement axis of the sensor.

In currently known installations, the magnetoresistive sensor positioned above the electronic circuit to be analysed is connected to a spectrum analyser and a synchronous detector.

The spectrum analyser allows the establishment, for all the frequencies of a predetermined range, of the frequency component of the signal from the magnetoresistive sensor.

The synchronous detector in turn brings about the synchronisation of the measurement at the output of the sensor with the reference frequency sent to the input of the same sensor.

Obtaining the result of the measurement is very long and may take 30 seconds. Thus, such installations can be used only in order to carry out a limited number of measurements at the surface of the circuit to be analysed.

Those installations are further extremely expensive owing to the presence of a spectrum analyser and a synchronous detector.

The object of the invention is to provide a device for measuring a magnetic field which is less costly and which allows a usable result of the measurement to be obtained rapidly.

To that end, the invention relates to a device for measuring a magnetic field of the above-mentioned type, characterised in that the measurement chain comprises means for isolating a frequency component of the signal from the sensor representative of the magnetic field for a single predetermined frequency.

According to specific embodiments, the device comprises one or more of the following features:

it comprises an alternating power supply generator for the magnetoresistive or magnetoinductive sensor at an excitation frequency and the excitation frequency is greater than or equal to the predetermined frequency of the frequency component to be isolated;

the measurement chain comprises a band-pass filter which is configured so as to isolate only the frequency component at the single predetermined frequency of the signal from the sensor representative of the magnetic field;

the band-pass filter comprises an operational amplifier;

the measurement chain comprises a generator for a reference signal whose frequency is greater than or equal to the single predetermined frequency of the frequency component to be isolated and it comprises a multiplier which is able to bring about a multiplication of the signal from the sensor and the reference signal;

the multiplier is suitable for carrying out an analogue multiplication of the two signals; and the measurement chain comprises two analogue/digital converters which are able to bring about a conversion of the signal from the sensor and the reference signal, as well as a digital processor which is able to bring about the multiplication of the two digital signals from the analogue/digital converters.

The invention also relates to a device for analysing a magnetic field produced by a circuit during operation comprising means for exciting the circuit at a predetermined excitation frequency and a measurement device, characterised in that the single predetermined frequency of the frequency component to be isolated is equal to the excitation frequency of the circuit.

The invention will be better understood from a reading of the following description, given purely by way of example and with reference to the drawings, in which.

Figure 1:
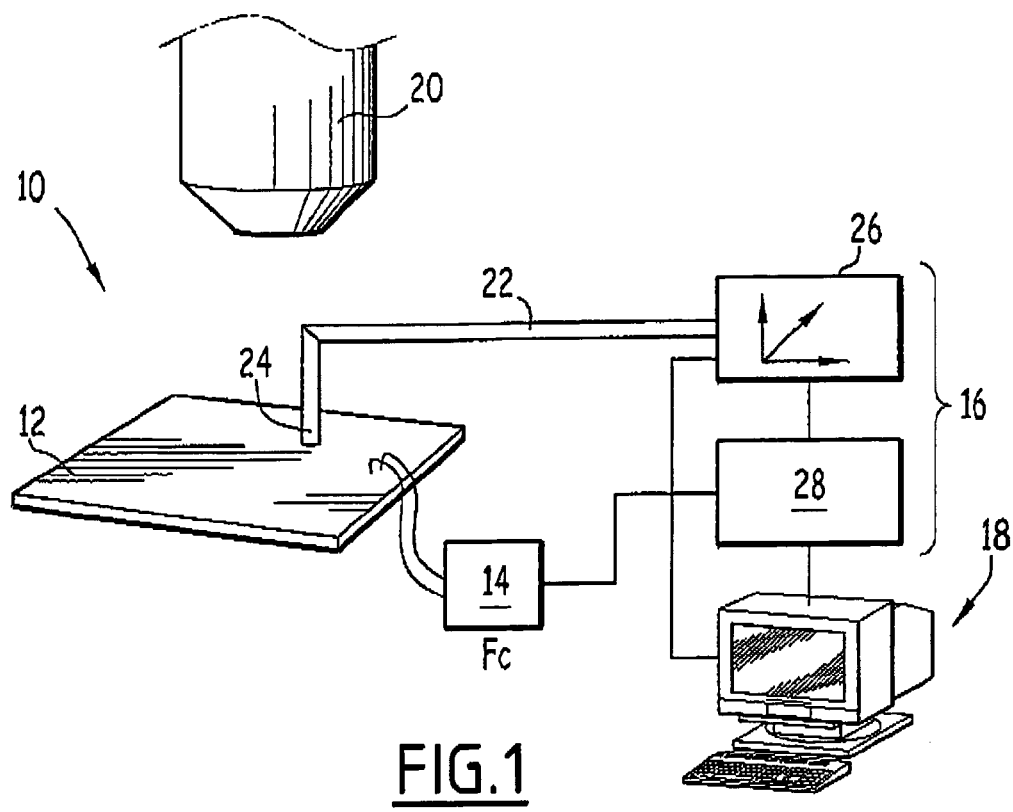
FIG. 1 is a perspective view of an installation for analysing an integrated circuit.

The installation illustrated in FIG. 1 is intended for analysing an integrated circuit during operation.

This installation substantially comprises a support plate 12 for an integrated circuit C, a circuit 14 for exciting the integrated circuit at a predetermined frequency designated FC, a device 16 for analysing the magnetic field produced by the circuit C during operation and means 18 for implementing the results obtained at the output of the device for analysing the magnetic field 16. The installation further comprises means 20 for observing the integrated circuit during operation. Those means are known per se and will not be described in detail.

The support 12 on which the circuit C is positioned is formed by a panel of mumetal or comprises, in the lower portion thereof remote from the circuit, a panel of mumetal which forms a barrier to the magnetic field. The circuit C is advantageously confined in a mumetal case.

The excitation circuit 14 is formed, for example, by a frequency generator which is able to supply the circuit with power at the predetermined frequency FC. That excitation frequency FC is, for example, 160 kHz.

The analysis means 16 comprise a manipulation arm 22 which is provided, at its free end, with a measurement probe 24 which is able to determine a characteristic value of the magnetic field at the location of the probe.

The manipulation arm 22 is connected to a mechanism 26 for displacing the probe, allowing, as known per se, it to be displaced in three directions perpendicular to each other and to know the position of the probe relative to the circuit in a precise manner.

The analysis means 16 further comprise a processing chain 28, to which the probe 24 is connected for processing the signal from the probe. That processing chain is connected to the processing means 18 in order to provide them with one or more processed values of the magnetic field measured by the probe 24.

The processing means 18 are formed, for example, by a PC type computer comprising input cards which are connected to the output of the processing chain 28. It further comprises control cards which allow control of the analysis means 16 and, more precisely, the displacement means 26, the processing chain 28 and the excitation circuit 14.

The processing means 18 comprise software modules which allow control of the means 16 for analysing the magnetic field, and in particular the excitation circuit 14, the displacement means 26 and the processing chain 28. They further comprise software modules for processing the signals from the means for analysing the field.

Figure 2:
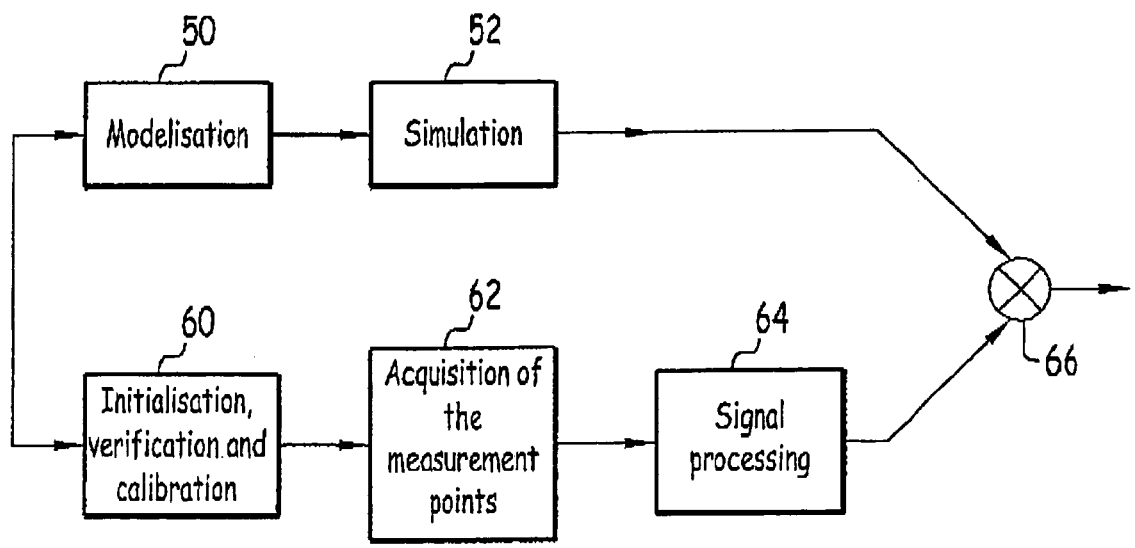
FIG. 2 is a flow chart explaining the operation of the installation of FIG. 1.

In particular, the processing means 18 are able to carry out the algorithm illustrated in FIG. 2, a software module being provided for each step of the algorithm.

In order to analyse an electronic circuit during operation, modelling of the circuit can first be carried out, in step 50, from the graphical representation of the circuit. That modelling, which is, for example, vectorial, is carried out using any suitable software. The modelling is intended to establish the position of the various tracks and various electronic components constituting the circuit C.

At the end of that modelling operation, simulation of the operation of the circuit is carried out in step 52. The characteristics of the magnetic field above the circuit are determined by that simulation operation, at each point of the circuit, in particular by applying Maxwell's equations. There is thus determined, for each element of the circuit, the current which flows therein as well as the three components of the magnetic field designated $B_x$, $B_y$ and $B_z$, at a measurement point located immediately above the circuit and for various predetermined positions which can be occupied by the measurement probe 24.

At the same time as the modelling and simulating steps, the processing means 18 control effective measurement of the magnetic field by the means 16 for analysing the field at each relevant measurement point during the simulation.

In step 60, the means 16 for analysing the field are first initialised and calibrated. The correct operation thereof is also verified. Furthermore, reference measurements are carried out on a known calibration test-piece whose components of the magnetic field which it produces are known.

Acquisition of the various measurement points is then carried out in step 62. This step consists in carrying out a measurement of at least one component of the magnetic field at a plurality of predetermined measurement points above the circuit C during operation. To that end, the probe is displaced under the control of the displacement means 26 in order to scan the surface of the circuit, for example, by following a boustrophedon type path. Before each operation for acquiring a measurement, the measurement probe is stopped at the measurement point so that the result of the measurement is not affected by the displacement of the probe.

The actual acquisition of each measurement will be described below.

Advantageously, but not necessarily, step 62 also provides for the acquisition of measurement points when the circuit C is not operational in order to measure, at each measurement point, the component(s) of the ambient magnetic field.

In step 64, the signal acquired for each measurement point is processed in order in particular to correct errors and discrepancies resulting from the measurement, those errors and discrepancies being corrected by techniques of comparison with the table of data acquired using a reference test-piece during step 60.

During step 64, values from the measurements of the field in accordance with one or more directions designated $B_x$, $B_y$, $B_z$ are calculated and in particular the spatial variations of the components of the field in accordance with the three directions designated $dB_x/dy$, $dB_x/dz$, $dB_y/dz$, $dB_y/dx$, $dBz/dx$ and $dB_z/dy$.

Furthermore, the magnitude and direction characteristics of the current in the circuit below the measurement point are determined by applying Maxwell's law J=Rot B where J is the current vector and B is the magnetic field vector.

In step 66, the values from the signal processing step 64 and the values obtained following the simulation carried out in step 52 are compared in order to deduce whether the real operation of the circuit is correct or not and to determine the discrepancy zones between the theoretical circuit and the real circuit during operation.

Figure 3:
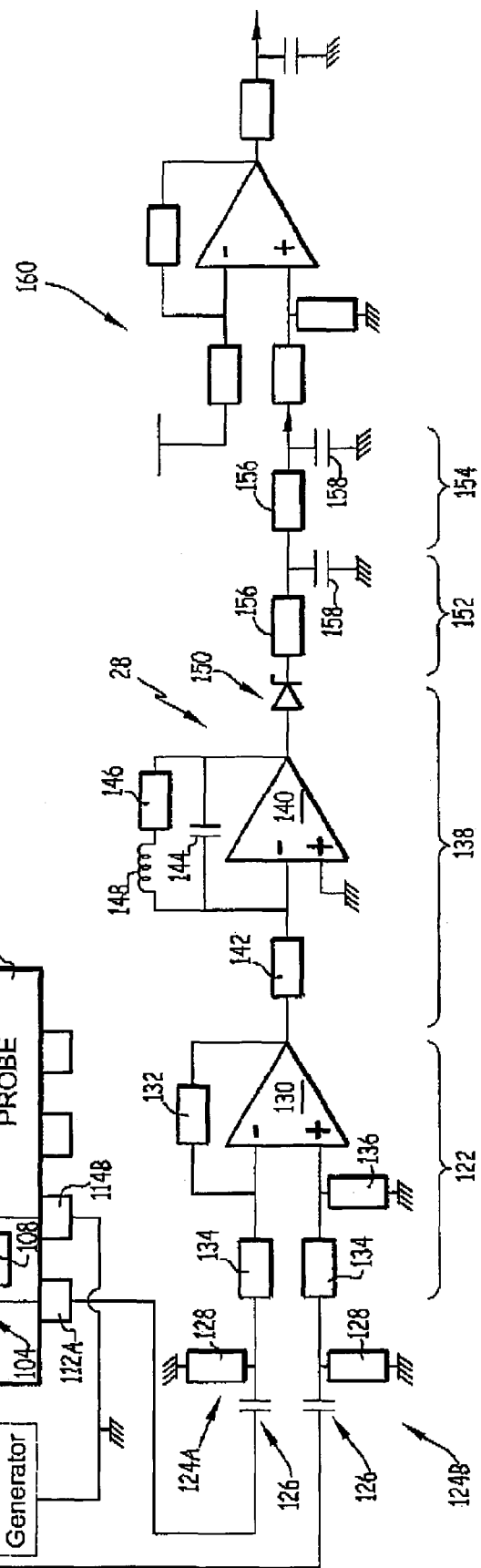
FIG. 3 is a schematic view of a first embodiment of a device for measuring a magnetic field according to the invention.

FIG. 3 schematically illustrates the means 16 for analysing the magnetic field, and more precisely the probe 24 and the processing chain 28 constructed in accordance with a first embodiment of the invention.

The probe 24 illustrated in this Figure is able to measure the component of the magnetic field in accordance with only one direction parallel with the plane of the circuit 14. To that end, it comprises a single magnetoresistive sensor.

Advantageously by way of a variant, the probe comprises a plurality of magnetoresistive sensors which are arranged in accordance with directions which are angularly offset and advantageously perpendicular relative to each other, each sensor being connected to a specific processing chain 28, as illustrated in FIG. 3.

The measurement head 24 comprises a measurement probe 100 which is constituted by an integrated circuit which comprises a magnetoresistive sensor designated 102. That magnetoresistive sensor is a component whose resistance varies in accordance with the magnetic field in which it is located. Such a sensor has a selected measurement axis which is indicated schematically by an arrow. The resistance of the component is substantially influenced by the component of the magnetic field in accordance with that selected measurement axis.

The magnetoresistive sensor may be of the GMR type (Giant Magneto Resistive), the GMI type (Giant Magneto Impedance), the CMR type (Collossal Magneto Resistive) or the TMR type (Tunneling Magneto Resistive). Preferably, the magnetoresistive sensor is of that last type. There may be, for example, sensors of the MTJ type (Magnetic Tunnel Junction) or the SDT type (Spin Dependent Tunneling).

As illustrated in FIG. 3, the magnetoresistive sensor 102 is integrated in a Weston bridge 104 comprising three other fixed resistors 106, 108, 110 having predetermined values. The four resistors are connected in series in order to form a loop, as known per se, in the structure of a Weston bridge. Two of the opposing terminals of the Weston bridge form measurement outputs 112A, 112B of the probe 100. The other two terminals 114A, 114B of the Weston bridge form power supply inputs of the Weston bridge. They are connected to the terminals of a generator 116 producing a sinusoidal signal having a predetermined frequency designated f. That frequency is far greater than the frequency component of the field which it is desirable to determine. It is, for example, equal to 1.60 MHz.

Furthermore, as known per se, the measurement probe 100 comprises a winding 118 which is connected to an external source of alternating voltage 120. The winding 118 is suitable for producing a polarisation field in the region of the magnetoresistive sensor in order to place the sensor in an operating zone where the sensitivity is optimised and the hysteresis is minimised.

The outputs 112A, 112B of the measurement probe are connected to the processing chain 28.

They are connected, at the input, to a differential amplification stage 122 which forms a subtractor by means of two high-pass filters 124A, 124B, to the inputs of which there are connected the output terminals 112A and 112B, respectively.

The differential amplification stage 122 is configured so as to produce a gain, for example, equal to 100.

The high-pass filters are RC type passive filters comprising a capacitor 126, one terminal of which is connected to earth by a resistor 128.

The differential amplification stage is of any suitable known type and comprises, for example, an operational amplifier 130, whose feedback loop is provided with a resistor 132, the inverting and non-inverting inputs of the operational amplifier being connected to the outputs of the filters 124A, 124B by two input resistors 134. The non-inverting terminal of the operational amplifier is connected to earth by a resistor 136 which fixes an input voltage.

The output of the differential amplifier 120 is connected to the input of isolation means 138 having a predetermined frequency component of the signal representative of the magnetic field from the measurement probe. The frequency of the component of the field to be determined is designated FI. That frequency is, for example, equal to 160 kHz.

In the embodiment illustrated in FIG. 3, those isolation means 138 comprise an active selective filter of the band-pass type which is centred on the frequency FI of the frequency component to be isolated. That frequency is equal to the excitation frequency F of the circuit C.

That filter comprises an operational amplifier 140 whose non-inverting terminal is connected to earth. The inverting terminal of the filter is connected to the output of the differential amplification stage 122 by an input resistor 142. The feedback loop of the differential amplifier 140 comprises a capacitor 144 which is connected in parallel to a resistor 146 which is itself connected in series to a coil 148.

At the output, the selective filter 138 has a BAT type diode 150 followed by two passive low-pass filters 152, 154, each formed by a resistor whose output terminal is connected to earth by a capacitor 158.

The processing chain 28 allows the frequency component of the magnetic field detected by the magnetoresistive sensor to be obtained by means of a very simple circuit.

During operation of the device for measuring the magnetic field, the value of the resistance of the magnetoresistive sensor 102 varies in accordance with the magnitude of the magnetic field in accordance with the selected measurement axis of the sensor. In this manner, the amplitude of the signal measured at the output terminals 112A, 112B varies in accordance with the magnetic field.

The two high-pass filters 124A, 124B bring about filtering of the interfering frequencies resulting from the external environment.

The differential amplification circuit 122 produces at the output a signal whose magnitude is proportional to the potential difference between the two terminals 122A, 122B. The selective filter 138 centred on the excitation frequency of the circuit C brings about isolation of the frequency component of the field for that frequency.

The two low-pass filters 152, 154 bring about new filtering, allowing the interfering components to be suppressed.

An output stage 160 can advantageously be added in order to output from it the continuous voltage value measured at the terminal of the non-loaded sensor. To that end, a differential amplifier is again used. The output signal above is applied to the inverting input of the differential amplifier and the continuous reference voltage is applied to the non-inverting input.

The control of the reference voltage is carried out by adjusting the value of the adjustable resistance so as to measure a zero value at the output of that second differential amplifier. The measurement is carried out by polarising the sensor magnetically (in order to be offset in the hysteresis cycle) without polarising the circuit C.

The signal from the processing, chain is received by the processing means 18.

In that manner, it will be understood that the processing chain allows a measurement value of the magnetic field to be obtained very rapidly, and more precisely a component of that magnetic field.

Figure 4:
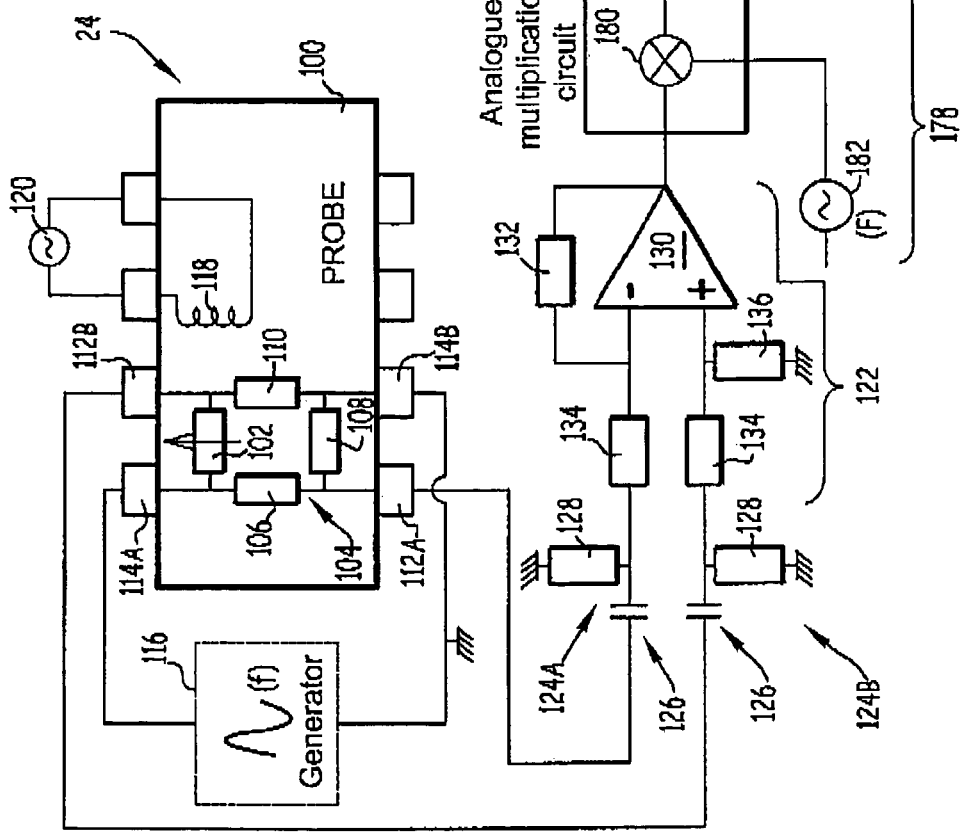
FIGS. 4 and 5 are views identical to FIG. 3 of construction variants of a measurement device.
Figure 5:
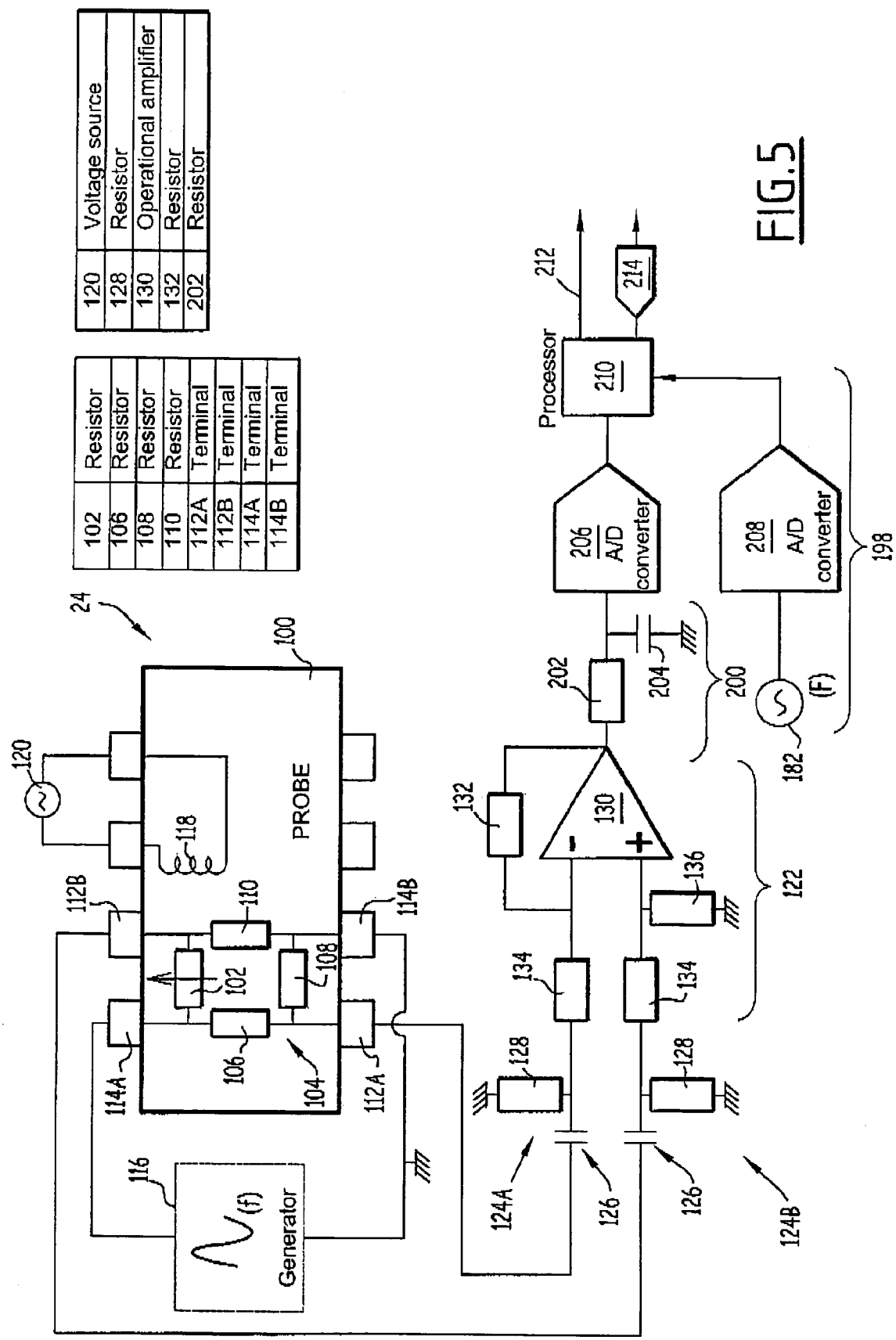

FIGS. 4 and 5 illustrate construction variants of a measurement device according to the invention. In those embodiments, identical or similar elements to those of FIG. 3 are indicated using the same reference numerals.

In those two construction variants, only the processing chain differs owing to the means used downstream of the differential amplification stage 122.

In the two cases, the isolation means of the frequency component of the magnetic field for a predetermined frequency comprise a multiplication circuit 180 allowing combination of the signal from the differential amplification stage 122 and a reference signal, whose frequency FC is greater than or equal to the operational frequency f of the circuit imposed by the excitation circuit 14. The use of the multiplier affords flexibility with regard to selecting the frequency (160 kHz).

In the embodiment of FIG. 4, the isolation means comprise an analogue multiplication circuit 180, one input of which is connected at the output of the differential amplification stage 122 and the other input of which is connected to a sinusoidal voltage generator 182, whose reference frequency F is greater than the predetermined frequency FI of the frequency component to be isolated.

A low-pass filter 184 constituted by a resistor 186 and a capacitor 188 is provided at the output of the multiplication circuit. Advantageously, a subtraction circuit 190 is provided at the output of the low-pass filter 184 in order to bring about the comparison of the filtered signal obtained at the output with an imposed reference signal designated Vref. The subtraction circuit comprises an operational amplifier 192, the feedback loop of which has an adaptive resistor 194 and to the non-inverting terminal of which a voltage Vref is applied.

As in the embodiment of FIG. 3, an output stage 160 is arranged at the output of the subtraction circuit.

In accordance with a specific embodiment, the voltage source 182 is formed by the voltage source 116 which supplies the Weston bridge 104.

In that method, the power supply frequency of the sensor is identical to the frequency of the frequency component sought.

In the embodiment of FIG. 5, the means for isolating the predetermined frequency component are formed by a digital processor which brings about the multiplication of the signal obtained at the output of the differential amplification stage 122 and a reference signal.

As illustrated in FIG. 5, a low-pass filter 200 which is constituted by a resistor 202 and a capacitor 204 is provided at the output of the differential amplification stage. An analogue/digital converter 206 is connected at the output of the filter 200 in order to bring about digitisation of the signal.

Furthermore, the processing chain includes, as above, a source, which is also designated 182, of a sinusoidal reference voltage. An analogue/digital converter 208 is connected at the output of that source 182. The analogue/digital converters have a sampling frequency which is far greater than the frequency of the signals received. It is, for example, greater than 500 kHz.

A high-speed processor 210, such as a DSP type circuit, is provided in the processing chain. It receives, at the input, the signals from the two analogue/digital converters 206 and 208 and is programmed to bring about multiplication of the two signals.

In this manner, the multiplied signals are sent to the processing means 18 either via a digital connection, such as an RS232 type connection designated 212, or via an analogue connection, a digital/analogue converter 214 being connected at the output of the processor 210.

In this case, the multiplication of the two signals is carried out by the processor 210. The subtraction operation carried out by the output stage 160 in FIGS. 3 and 4 is also brought about by the processor 210.

In a variant, the magnetoresistive sensors are replaced with magnetoinductive sensors.

The invention claimed is:

1. Device (16) for measuring at least one component of a magnetic field comprising a magnetoresistive or magnetoinductive sensor (102) and a measurement chain (28), one input of which is connected to the magnetoresistive or magnetoinductive sensor (102), an alternating power supply generator (116) for the magnetoresistive or magnetoinductive sensor (102) at an excitation frequency (f), and the output of which is able to provide a piece of information representative of the magnetic field in the region of the sensor, the measurement chain (28) comprising means (138; 178; 198) for isolating a frequency component of the signal from the sensor representative of the magnetic field for a single predetermined frequency (FI), characterized in that the excitation frequency (f) is greater than the predetermined frequency (FI) of the frequency component to be isolated.

2. Measurement device according to claim 1, characterised in that the measurement chain (28) comprises a bandpass filter (138) which is configured so as to isolate only the frequency component at the single predetermined frequency (FI) of the signal from the sensor representative of the magnetic field.

3. Measurement device according to claim 2, characterised in that the band-pass filter (138) comprises an operational amplifier (130).

4. Measurement device according to claim 1, characterised in that the measurement chain (28) comprises a generator for a reference signal whose frequency (F) is greater than or equal to the single predetermined frequency (FI) of the frequency component to isolate, and in that it comprises a multiplier (180, 210) which is able to bring about a multiplication of the signal from the sensor and the reference signal.

5. Measurement device according to claim 4, characterised in that the multiplier (180) is suitable for carrying out an analogue multiplication of the two signals.

6. Measurement device according to claim 4, characterised in that the measurement chain (24) comprises two analogue/digital converters (206, 208) which are able to bring about a conversion of the signal from the sensor and the reference signal, as well as a digital processor (210) which is able to bring about the multiplication of the two digital signals from the analogue/digital converters (206, 210).

7. Device for analysing a magnetic field produced by a circuit during operation comprising means (14) for exciting the circuit at a predetermined excitation frequency (FC) and a measurement device (16) according to claim 1, characterised in that the single predetermined frequency (FI) of the frequency component to be isolated is equal to the excitation frequency (FC) of the circuit.

8. Measurement device according to claim 1, characterised in that the measurement chain (28) comprises a bandpass filter (138) which is configured so as to isolate only the frequency component at the single predetermined frequency (FI) of the signal from the sensor representative of the magnetic field.

9. Measurement device according to claim 1, characterised in that the measurement chain (28) comprises a generator for a reference signal whose frequency (F) is greater than or equal to the single predetermined frequency (FI) of the frequency component to isolate, and in that it comprises a multiplier (180, 210) which is able to bring about a multiplication of the signal from the sensor and the reference signal.

* * * * *